United States Patent [19]

Takagi et al.

[11] Patent Number: 4,827,116

[45] Date of Patent: May 2, 1989

[54] SQUARE WAVE MODULATION CIRCUIT FOR LASER DIODE

[75] Inventors: Yasutomo Takagi; Kazuyoshi Takaishi, both of Tokyo, Japan

[73] Assignee: Ando Electric Co., Ltd., Tokyo, Japan

[21] Appl. No.: 153,109

[22] Filed: Feb. 8, 1988

[30] Foreign Application Priority Data

Feb. 6, 1987 [JP] Japan .................................. 62-25720

[51] Int. Cl.⁴ ............................................. H01S 3/13
[52] U.S. Cl. ...................................... 250/205; 372/29; 372/38
[58] Field of Search ................ 250/205; 307/262, 268, 307/311, 362; 315/149–151, 156; 372/29, 31, 38

[56] References Cited

U.S. PATENT DOCUMENTS

| | | | |
|---|---|---|---|
| 4,611,352 | 9/1986 | Fujitoet al. | 372/31 |
| 4,689,795 | 8/1987 | Yoshimoto et al. | 372/31 |
| 4,709,369 | 11/1987 | Howard | 372/31 |
| 4,745,609 | 5/1988 | Yoshikawa | 372/31 |
| 4,768,198 | 8/1988 | Deki | 372/31 |
| 4,771,431 | 9/1988 | Nakazawa et al. | 372/38 |

Primary Examiner—David C. Nelms
Assistant Examiner—Stephone B. Allen
Attorney, Agent, or Firm—Seidel, Gonda, Lavorgna & Monaco

[57] ABSTRACT

A laser diode square wave modulation circuit includes a sample/hold circuit, a smoothing circuit and a laser driver with devices for regulating its output power. The sample/hold circuit maintains the signal to modulate free from square component even when a feedback loop to regulate the laser output applies a square wave to it.

1 Claim, 3 Drawing Sheets

SQUARE WAVE MODULATION CIRCUIT FOR LASER DIODE

BACKGROUND OF THE INVENTION

1. Field of the Invention

The present invention relates to a modulation circuit for laser diode. More particularly, it relates to a low frequency square wave modulation circuit for laser diode which operates in a laser diode driving circuit to regulate the intensity of the laser output. Hereinafter the aforesaid driving circuit is called an APC circuit which is composed from the devices of; sampling a fraction of light emitted from the laser diode, controlling a driving current to be input to a diode driver for laser diode by output signal from the aforesaid sampling device in order to regulate an intensity of the laser output.

2. Decription of the Prior Art

FIG. 2 illustrates a sample of a block diagram of a square wave modulation circuit in the prior art. It is composed from a photo detector (1), a current-voltage converter (2), a differential amplifier (3), a reference voltage generator (4) a smoothing circuit (5), a square wave generator (6), a diode driver (7) and a laser diode (8).

FIG. 2 is also at the same time an APC circuit which has the function to regulate the output intensity of laser diode (8) at a constant level.

The photo detector (1) samples a fraction of light emitted from the laser diode (8), an output current from aforesaid photo detector (1) is converted to voltage by the current-voltage converter (2) which, in turn, is inputted to the differential amplifier (3).

For example, when an output intensity of laser diode (8) is 1 mW, the photo detector generates a current of about 0.1 mA through sampling.

The output of the reference voltage generator (4) is applied to the other terminal of the differential amplifier (3). Then the differential amplifier (3) boosts the difference between the output of the reference voltage generator (4) and output voltage of the aforesaid current-voltage converter (2) in order to supply an output signal to a diode driver (7) through a smoothing circuit (5).

For example, the differential amplifier (3), with the reference voltage generator (4) of 0.8 V, may satisfy the conditions below; the output of differential amplifier (3) is −8 V when an input voltage of 0.8 V is applied from the current-voltage converter (3), it becomes to −9 V when the input voltage is changed to 0.9 V, and the output of said differential amplifier (3) varies to −7 V when it receives the input of 0.7 V from current-voltage converter (2). Thus, the output of differential amplifier increases or decreases according as the corresponding output of current-voltage converter (2) decreases or increases.

The diode driver (7) feeds the driving current to the laser idode (8).

FIG. 2 illustrates a feedback loop comprising laser diode (8), photo detector (1), current-voltage converter (2), differential amplifier (3), smoothing circuit (5), diode driver (7) and laser diode (8) to regulate the output intensity of laser diode (8).

The output intensity of laser diode (8) becomes stable according as the output voltage from the current-voltage converter (2) gets close to that of the reference voltage generator (4), and it is most stable when the two voltages get equivalent.

A square wave generator (6) is connected to the smoothing circuit (5) in order to impose a square wave modulation on the photo output of the laser diode (8).

The smoothing circuit (5) with a large time constant is required for the feedback loop not to generate the photo output by the APC circuit when the square wave photo output is "OFF" in FIG. 2.

The aforesaid smoothing circuit (5) is composed of an integrating circuit and it integrates input signal to generate the photo output square wave with a level of the mean value of the input signal.

According as a frequency of the square wave becomes lower, a larger time constant is required. As a matter of fact, due to the marginal value of applicable time constant, a problem arises that it is difficult to perform the square wave modulation at low frequency such as about 270 Hz, in such a circuit shown in FIG. 2.

THE BRIEF DESCRIPTION OF THE FIGURES

THE PURPOSE OF THE INVENTION

Figure 2:
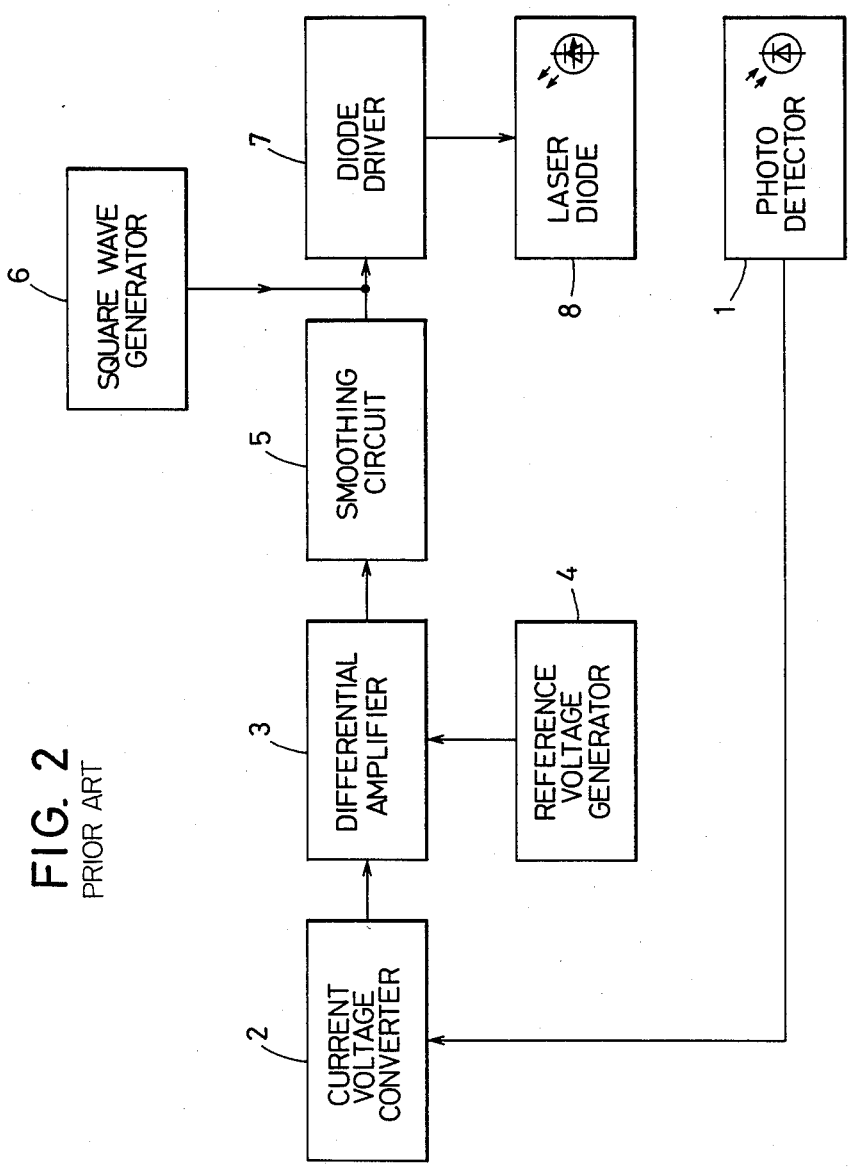
FIG. 2 is a block diagram which illustrates an example of the square wave modulation circuit for laser diode in the prior art.

An object of the present invention is to provide a square wave modulation circuit for laser diode which operates even in the lower frequency range comprising an APC circuit and a sample/hold circuit which is added to aforesaid APC circuit in FIG. 2.

The following example are given merely to aid in the understanding of the present invention, and variations may be made by one skilled in the art without departing from the spirit and scope of the present invention.

DESCRIPTION OF THE PREFERRED EMBODIMENT

Figure 1:
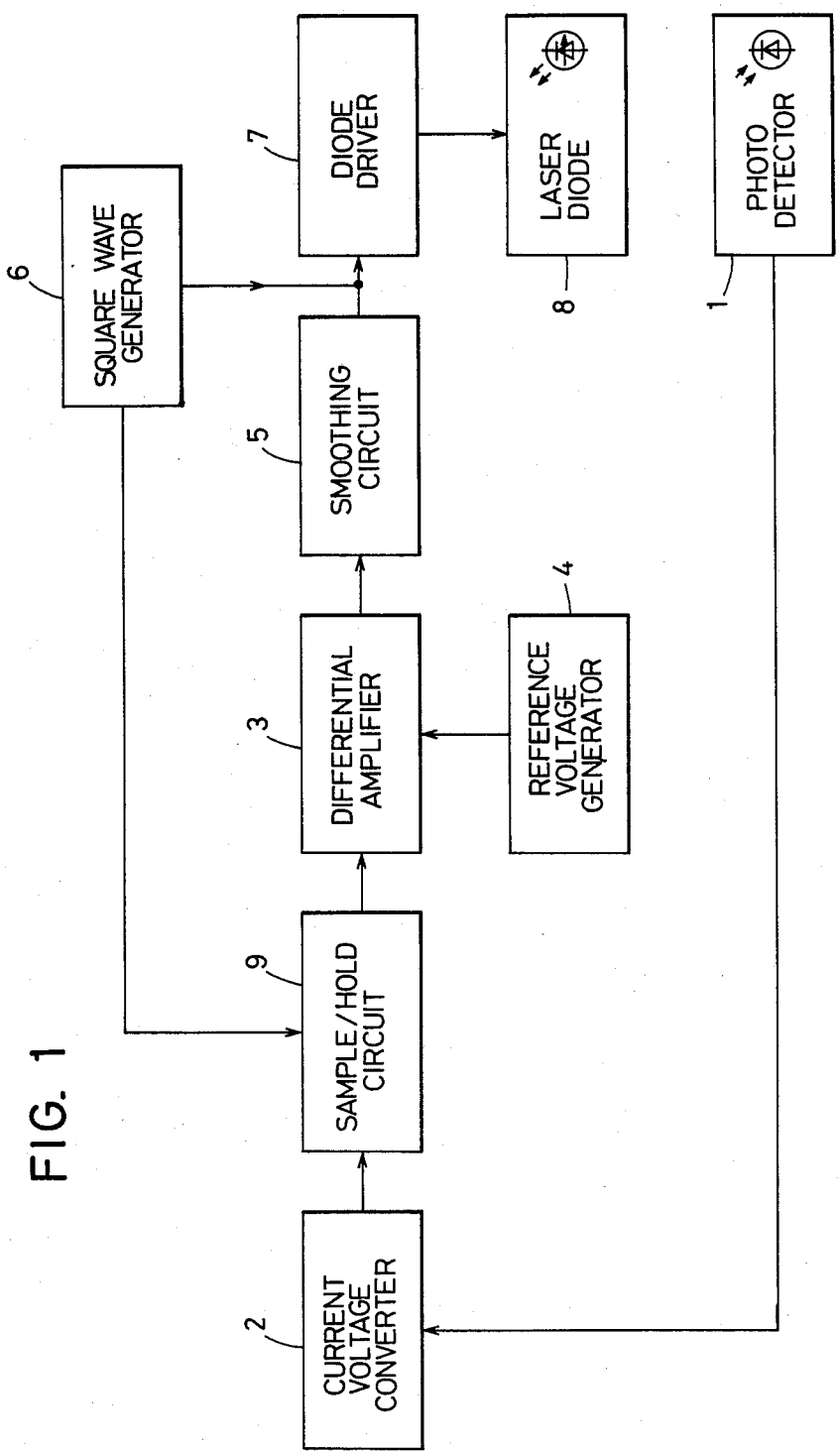
FIG. 1 is a block diagram which illustrates an example of the square wave modulation circuit for laser diode of the present invention.

FIG. 1 illustrates an example of the block diagram of the present invention. A sample/hold circuit (9) is introduced and the other elements are similar to those in FIG. 2. That is to say, FIG. 1 is a circuit in which a sample/hold circuit (9) is added to the circuit in FIG. 2.

In FIG. 1 the sample/hold circuit (9) is operated by a control signal to sample the square wave which has been converted by the current-voltage converter (2) when said square signal is applied to an input of the circuit (9). Herein the aforesaid control signal is synchronized with the input square signal. Accordingly, the aforesaid sample/hold circuit (9) samples the input signal when the photo output is "ON", and otherwise hold it while the photo output is "OFF".

In other words, it applies the loop signal directly to the input of the differential amplifer (3) on occasions of sampling, and it keeps the signal at the level where the photo output was "ON" and applies the aforesaid signal to the input of the differential amplifier (3) during the holding period.

Accordingly, the signal applied to the input of the aforesaid differential amplifier (3) is regulated at a constant level in order to maintain the feedback loop in stable operation even when the square signal has been applied to the APC circuit and it makes the photo output signal square.

Herein the related wave forms of the present invention of FIG. 1 and the prior art of FIG. 2 are shown in FIG. 3.

Figure 3A:
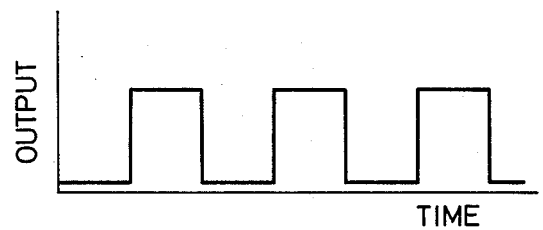
FIG. 3A is a diagrammatic representation of a wave form of an output signal from the current-voltage converter (2) of FIG. 1 and FIG. 2.

FIG. 3A demonstrates a wave form of an output signal of the current-voltage converter (2) of FIG. 1 and FIG. 2.

Figure 3B:
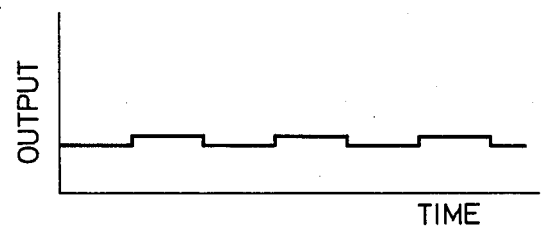
FIG. 3B is a diagrammatic representation of a wave form of an output signal sampled in the middle point of the smoothing circuit (5) in the prior art in FIG. 2.

FIG. 3B demonstrates a wave form of a signal which is sampled in the middle point of the smoothing circuit (5) of FIG. 2 in the prior art. It distinctly shows the fact that the square wave component could not be satisfactorily cut off only by employing the aforesaid smoothing circuit.

Figure 3C:
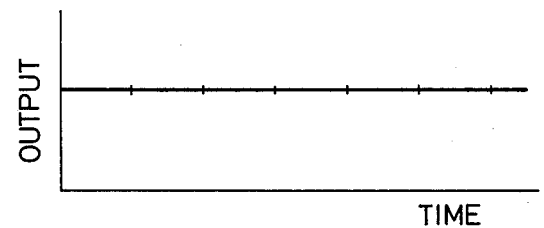
FIG. 3C is a diagrammatic representation of a wave form of an output signal of the differential amplifier (3) of the present invention in FIG. 1.

FIG. 3C demonstrates a wave form of an output signal of the differential amplifier (3) of the present invention in FIG. 3, in which the square wave component is almost undetectable.

As the aforesaid sample/hold circuit (9) is synchronized with the square wave signal, it can sufficiently minimize the square wave component even at a low frequency.

In accordance with the present invention, it provides the low frequency square wave modulation of laser diode with a stable operation of an APC circuit. It is because the laser output is driven by an APC circuit and not only a smoothing circuit is employed, but a sample/hold circuit is also introduced, which is connected to a current-voltage converter in order to operate synchronized with the square wave signal to modulate.

What is claimed is:

1. A square wave modulation circuit for laser diode comprising a feedback loop including;
    (A) a photo detector which samples light emitted from the laser diode,
    (B) a current-voltage converter to which is applied the output of said detector,
    (C) a differential amplifier to which is applied the output of said current-voltage converter and a reference voltage generator,
    (D) a smoothing circuit to which is applied the output of said differential amplifier,
    (E) a laser diode which is driven by the output of said smoothing circuit, characterized in that a sample/hold circuit is connected between said current-voltage converter and said differential amplifier, and said sample/hold circuit samples the output of the converter only when a photo output is "ON" and it holds while said output is "OFF".

* * * * *